(12) United States Patent
Kim et al.

(10) Patent No.: US 12,557,658 B2
(45) Date of Patent: Feb. 17, 2026

(54) MOLDED MODULE PACKAGE WITH AN EMI SHIELDING BARRIER

(71) Applicant: TEXAS INSTRUMENTS INCORPORATED, Dallas, TX (US)

(72) Inventors: Kwang-Soo Kim, Sunnyvale, CA (US); Woochan Kim, San Jose, CA (US); Vivek Kishorechand Arora, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 411 days.

(21) Appl. No.: 18/159,966

(22) Filed: Jan. 26, 2023

(65) Prior Publication Data

US 2024/0258245 A1    Aug. 1, 2024

(51) Int. Cl.
| | |
|---|---|
| *H01L 23/552* | (2006.01) |
| *H01L 21/56* | (2006.01) |
| *H01L 23/00* | (2006.01) |
| *H01L 23/31* | (2006.01) |
| *H01L 23/495* | (2006.01) |
| *H01L 23/498* | (2006.01) |

(52) U.S. Cl.
CPC ............ *H01L 23/552* (2013.01); *H01L 21/56* (2013.01); *H01L 23/3107* (2013.01); *H01L 23/49555* (2013.01); *H01L 23/49822* (2013.01); *H01L 23/49827* (2013.01); *H01L 24/32* (2013.01); *H01L 24/48* (2013.01); *H01L 24/73* (2013.01); *H01L 24/92* (2013.01); *H01L 2224/32225* (2013.01); *H01L 2224/48141* (2013.01); *H01L 2224/48245* (2013.01); *H01L 2224/73265* (2013.01); *H01L 2224/92247* (2013.01)

(58) Field of Classification Search
CPC ... H01L 23/28–3192; H01L 21/56–568; H01L 2924/181–186; H01L 23/552; H01L 23/556; H01L 23/60
See application file for complete search history.

(56) References Cited

U.S. PATENT DOCUMENTS

| | | | | |
|---|---|---|---|---|
| 4,953,002 | A * | 8/1990 | Nelson | H01L 23/552 174/559 |
| 5,406,117 | A * | 4/1995 | Dlugokecki | H01L 23/552 257/659 |
| 5,482,898 | A * | 1/1996 | Marrs | H01L 23/315 257/E23.128 |
| 5,559,306 | A * | 9/1996 | Mahulikar | H01L 23/552 174/532 |
| 6,562,655 | B1 * | 5/2003 | Glenn | H01L 23/4334 257/E23.092 |

(Continued)

FOREIGN PATENT DOCUMENTS

| | | | | | |
|---|---|---|---|---|---|
| CN | 106303862 | A | * | 1/2017 | ............... H04R 9/06 |
| CN | 106686962 | A | * | 5/2017 | ......... H05K 7/20445 |

*Primary Examiner* — Scott B Geyer
(74) *Attorney, Agent, or Firm* — Xiantun Qiu; Frank D. Cimino (57) ABSTRACT

An electronic device that includes a substrate and a die disposed on the substrate, the die having an active surface. Wire bonds are attached from the active surface of the die to the substrate. A radiation barrier is attached to the substrate and disposed over the die. The radiation barrier is configured to mitigate electromagnetic radiation exposure to the die. A mold compound is formed over the die, the wire bonds, and the radiation barrier.

19 Claims, 13 Drawing Sheets

(56) References Cited

U.S. PATENT DOCUMENTS

| | | | | |
|---|---|---|---|---|
| 6,614,102 B1* | 9/2003 | Hoffman | H01L 23/552 | 257/659 |
| 7,629,674 B1* | 12/2009 | Foster | H01L 21/56 | 257/659 |
| 9,704,812 B1* | 7/2017 | Lam | H01L 23/49541 | |
| 10,242,953 B1* | 3/2019 | Yenrudee | H01L 23/49513 | |
| 2004/0231872 A1* | 11/2004 | Arnold | H01L 23/552 | 257/E23.128 |
| 2005/0045358 A1* | 3/2005 | Arnold | H01L 23/295 | 174/51 |
| 2007/0090502 A1* | 4/2007 | Zhao | H01L 23/4334 | 257/E23.105 |
| 2007/0164409 A1* | 7/2007 | Holland | H01L 23/49575 | 257/E23.092 |
| 2008/0073756 A1* | 3/2008 | Heitzer | H01L 25/0657 | 257/659 |
| 2008/0258294 A1* | 10/2008 | Tseng | H01L 25/03 | 257/E23.101 |
| 2009/0127638 A1* | 5/2009 | Kilger | G01L 19/141 | 438/51 |
| 2009/0166819 A1* | 7/2009 | Chen | H01L 23/552 | 257/659 |
| 2009/0289335 A1* | 11/2009 | Camacho | H01L 23/49551 | 257/659 |
| 2012/0193737 A1* | 8/2012 | Pang | H01L 21/561 | 257/659 |
| 2013/0093629 A1* | 4/2013 | Chiu | H01Q 1/521 | 343/700 MS |
| 2014/0145353 A1* | 5/2014 | Cruzado | H01L 23/3135 | 257/659 |
| 2017/0207178 A1* | 7/2017 | Tadakuma | H01L 23/552 | |
| 2018/0184550 A1* | 6/2018 | Jenkins | B33Y 80/00 | |
| 2018/0301420 A1* | 10/2018 | Kim | H01L 21/4885 | |
| 2019/0027443 A1* | 1/2019 | Murtuza | H01L 23/16 | |
| 2019/0287818 A1* | 9/2019 | Huemoeller | H01L 23/552 | |
| 2020/0075502 A1* | 3/2020 | Kim | H01Q 1/2283 | |
| 2020/0211976 A1* | 7/2020 | Kim | H01L 23/28 | |
| 2021/0035917 A1* | 2/2021 | Fay | H01L 23/66 | |
| 2021/0193587 A1* | 6/2021 | Yada | H01L 21/561 | |
| 2021/0233832 A1* | 7/2021 | Uppal | H01L 23/3737 | |
| 2021/0259143 A1* | 8/2021 | Shin | H05K 9/0086 | |
| 2021/0327782 A1* | 10/2021 | Han | H01L 23/3675 | |
| 2021/0398873 A1* | 12/2021 | Nakada | H01L 24/49 | |
| 2022/0028798 A1* | 1/2022 | Sirinorakul | H01L 23/49503 | |

* cited by examiner

MOLDED MODULE PACKAGE WITH AN EMI SHIELDING BARRIER

TECHNICAL FIELD

The present disclosure relates to an electronic device and more specifically, to an integrated circuit package that includes a radiation barrier for electromagnetic radiation shielding.

Some integrated circuit (IC) packages include a shielding material for electromagnetic interference EMI shielding. One example package includes a metal lid where the metal lid is attached to a GND potential of a substrate so that the packaging components are covered by the metal lid. The metal lid, however, is made from an expensive material and also requires extra clearance from the internal components to avoid continuity failure. As a result, minimizing a thickness of the IC package is difficult, which is essential for RF devices in communication devices. In another example, metallic coating materials are also used in other IC packages. These materials, however, are also expensive and require additional assembly processes (e.g., coating, curing, etc.). Still further, metallic coating material have some limitations in EMI shielding performance owing to the intrinsic material characteristics.

SUMMARY

In described examples, an electronic device includes a substrate and a die disposed on the substrate, the die having an active surface. Wire bonds are attached from the active surface of the die to the substrate. A radiation barrier is attached to the substrate and disposed over the die. The radiation barrier is configured to mitigate electromagnetic radiation exposure to the die. A mold compound is formed over the die, the wire bonds, and the radiation barrier.

In still another described example, a method of fabricating an electronic device that includes providing a leadframe and depositing a die on the leadframe. Wire bonds are attached from the die to the leadframe. A radiation barrier is placed over the die and is configured to mitigate electromagnetic radiation exposure to the die. A mold compound is formed over the die, the wire bonds, and the radiation barrier.

DETAILED DESCRIPTION

Electromagnetic interference (EMI) is a phenomenon that occurs when an electronic device is exposed to electromagnetic (EM) radiation from an external source. EMI causes disorders in the normal operation of the electronic device. Some disorders may include a decrease in performance, an increase in error rate, and/or a total loss of information. In order to mitigate the disorders caused by EMI, some electronic devices include a shielding material to shield the components from EMI. For example, a metal lid may be attached to a ground potential of a substrate so that the packaging components are covered by the metal lid. Metal lids, however, are fabricated from expensive materials and also require extra clearance from the internal components to avoid continuity failure, which adversely affects reducing the size (e.g., thickness) of the electronic device. Other example electronic devices may include a metallic coating material. These materials, however, are also expensive and require additional assembly processes (e.g., coating, curing, etc.). In addition, metallic coating materials have some limitations in EMI shielding performance owing to the intrinsic material characteristics.

Disclosed herein is an electronic device and method of fabricating the electronic device that overcomes the challenges described above. The electronic device includes a radiation barrier that shields components in the electronic device from EM radiation caused by an external source. The radiation barrier is made from a metal foam material (e.g., copper, aluminum, nickel) and more specifically, from an open-cell metal foam material. Open-cell foam metal materials are lightweight and have a low density. Open-cell foam materials provide thermal and acoustic insulation, have a high capacity to absorb energy, and are highly conductive. The open-cell foam metal material improves EMI shielding and is compatible with electronic device molded packages.

Figure 1A:
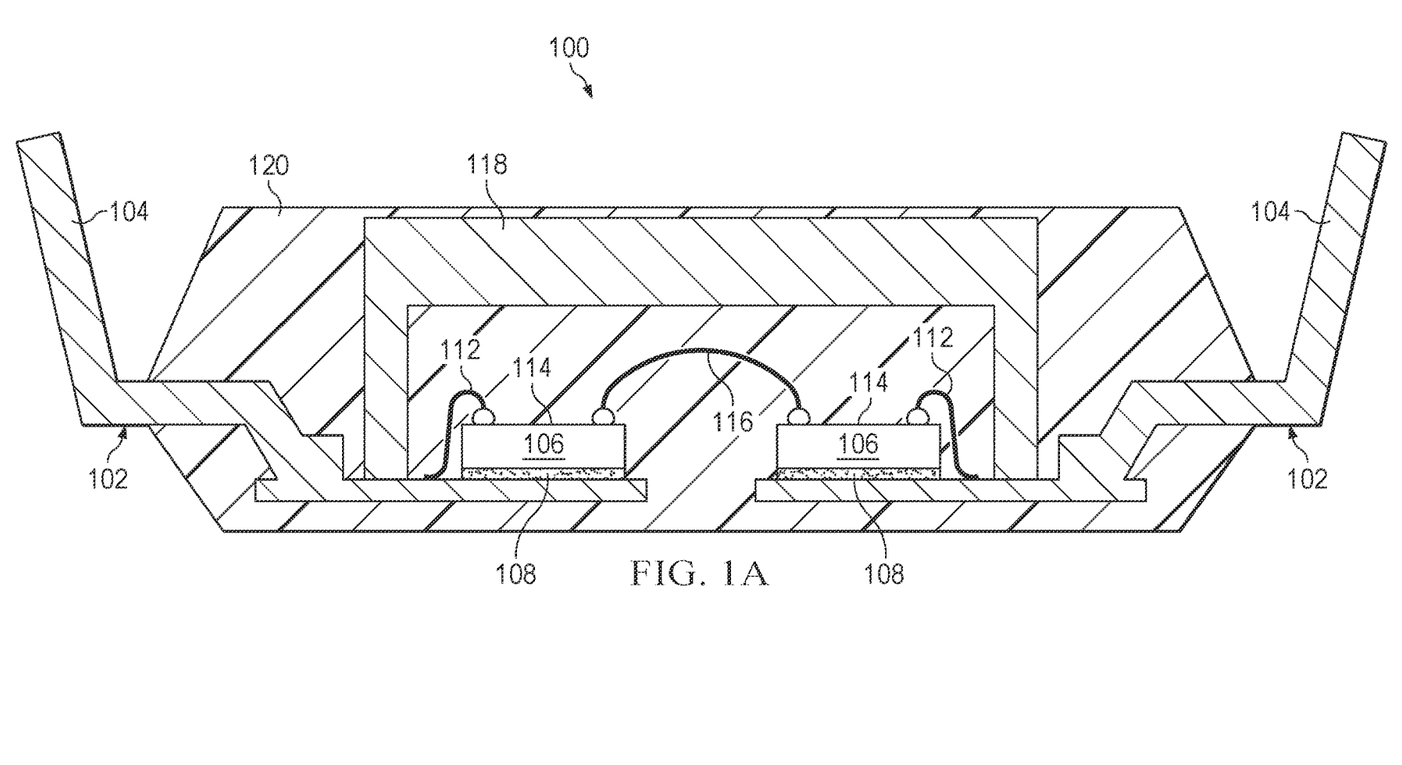
FIGS. 1A-1C are cross-sectional views of example electronic devices.
Figure 1B:
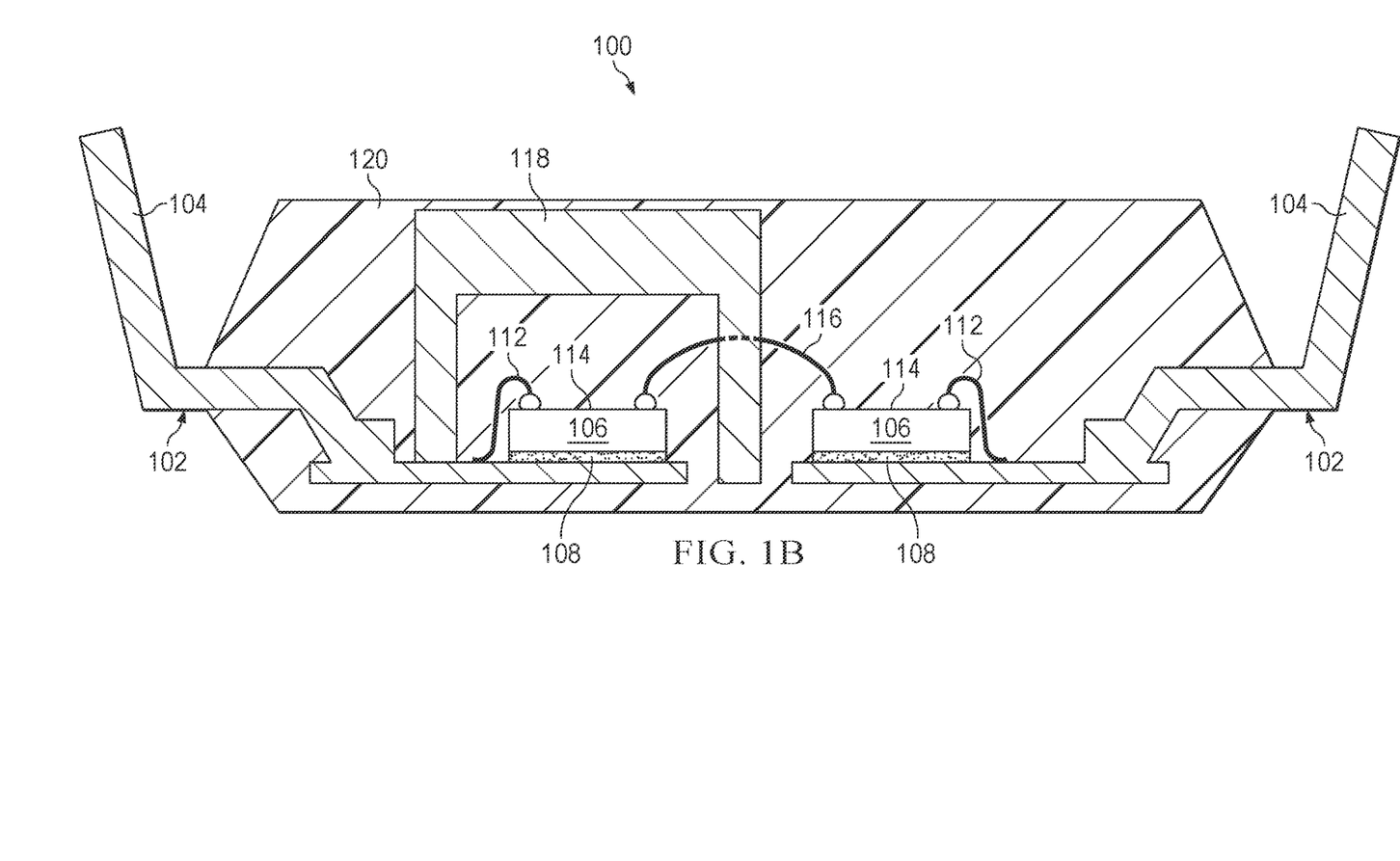
Figure 1C:
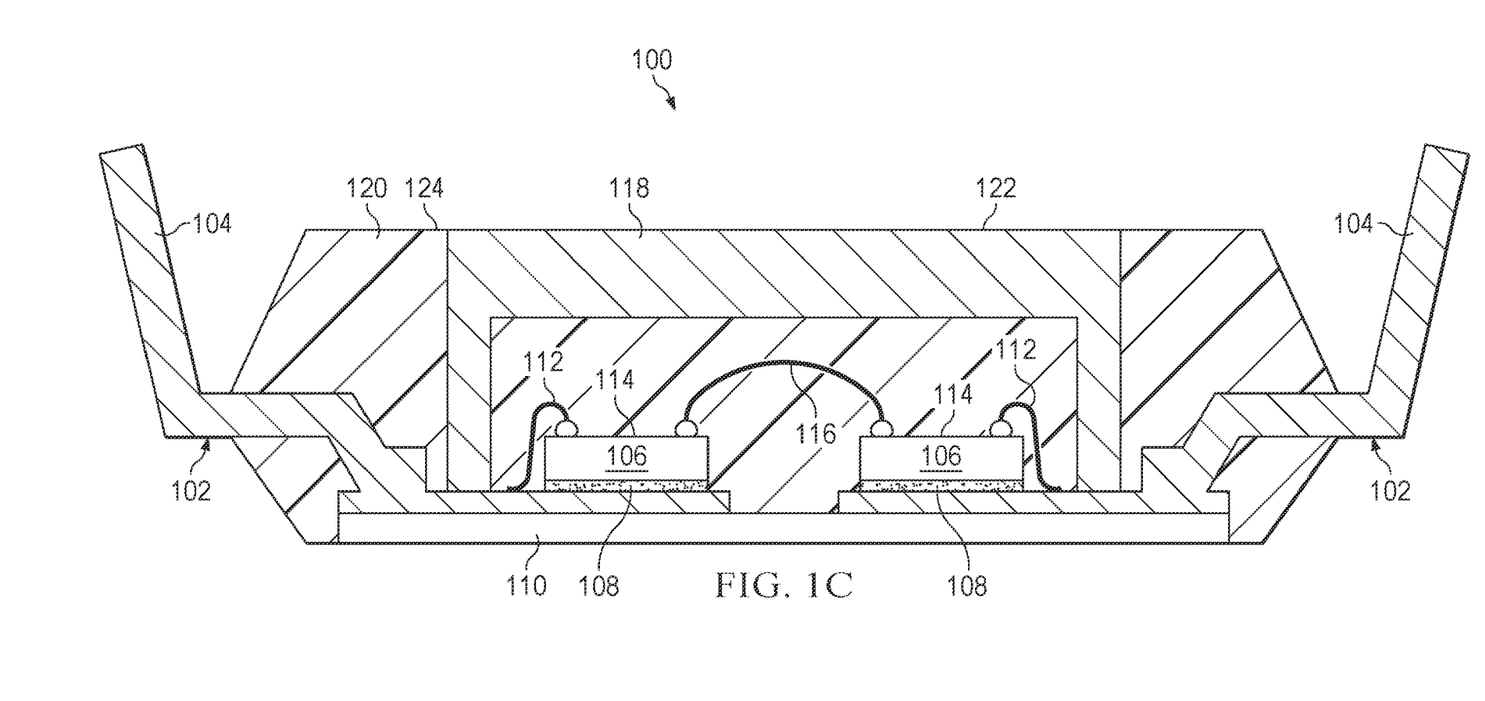

FIGS. 1A-1C are cross-sectional views of an example electronic device (e.g., integrated circuit (IC) package) 100 comprising a leadframe based substrate 102 having external leads 104 and at least one die 106 disposed on the leadframe 102 via a die attach material 108. The leadframe 102 may be attached to an optional substrate (e.g., ceramic including alumina, silicon nitride, aluminum nitride, boron nitride, etc.) 110, as illustrated in FIG. 1C. The electronic device 100 can comprise an integrated circuit (IC) package including, but not limited to a surface mount package (SMP), a through hole package (THP), a ball-grid array (BGA) package, a quad flat no-lead (QFN) package, a quad-flat package (QFP), etc. Although, FIGS. 1A-1C show two (first and second) dies 106, it is understood that the number of dies can range from 1-N, where N is a positive number greater than 0. Thus, the electronic device 100 illustrated in FIGS. 1A-1C is for illustrative purposes only and is not intended to limit the scope of the invention. The electronic device 100 further includes wire bonds 112 attached from an active surface 114 of the die 106 to the leadframe 102. In the example illustrated in FIGS. 1A-1C an additional wire bond 116 is attached to each active surface 114 of each die 106 to allow communication between the dies 106.

A radiation barrier 118 is disposed over the die(s) 106 and the wire bonds 112, 116. Alternatively, in a configuration that includes multiple dies 106, the radiation barrier 118 can be disposed over one die 106 (see FIG. 1B) or over a number of dies 106 that is less than the total number of dies 106 in the electronic device 100. As mentioned above, the radiation barrier 118 shields the die(s) 106 from EM radiation caused by an external source. The radiation barrier 118 is made from a metal foam material (e.g., copper, aluminum, nickel) and more specifically, from a porous, open-cell metal foam material and can range in thickness from 0.5 mm to 40 mm based on the application of the electronic device 100. The thicker the radiation barrier 118 the more effective the radiation barrier 118 protects against EMI. Thus, a thickness of the radiation barrier 118 that is less than 0.5 mm will not be as effective as a thickness that is greater than 0.5 mm. The thickness, however, cannot be unlimited due to packaging size and reliability limitations. Thus, a thickness exceeding 40 mm can have an undesirable overall package thickness and may have certain reliability of performance limitations.

An important property of the metal foam material is the EMI shielding effectiveness. The EMI shielding effectiveness is determined by measuring a difference between an intensity of the EMI with and without the radiation barrier 118, typically referred to as attenuation. Attenuation is marked in decibels (dB), which corresponds to a ratio between a field strength with and without the presence of the radiation barrier 118. The decrease in the EMI intensity is usually exponential with distance, while the decibel range falls along a logarithmic scale. Thus, an attenuation rating of 50 dB indicates a shielding strength ten times that of 40 dB. In general, a shielding range of 10 to 30 dB provides the lowest effective level of shielding and anything below that range can be considered little or no shielding. Shielding between 60 and 90 dB is considered to provide a high level of protection, while 90 to 120 dB is exceptional.

Figure 2:
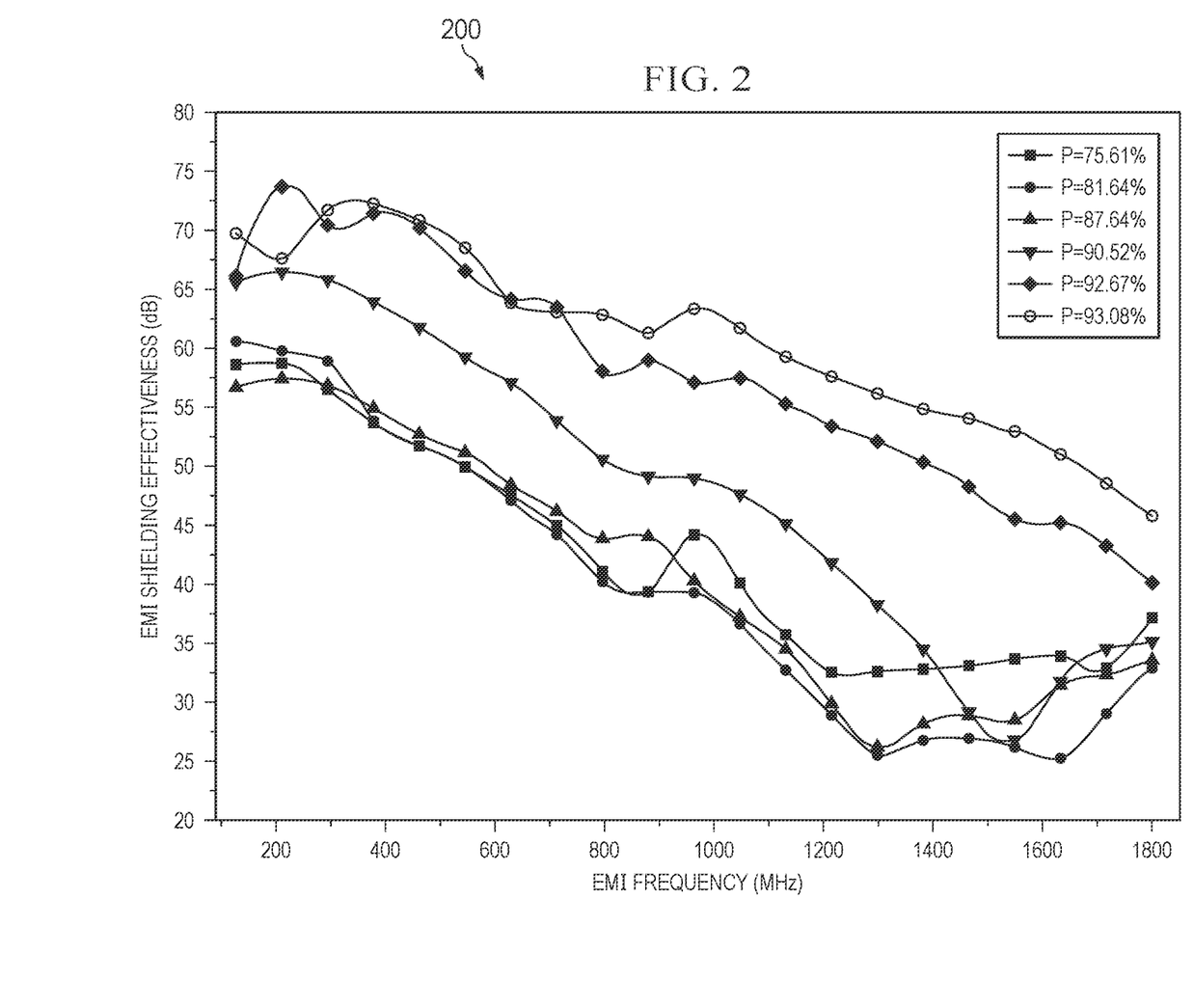
FIG. 2 is a graph illustrating an EMI effectiveness shielding of metal foam materials.

Referring to FIG. 2, tests have shown that the higher the porosity of a metal foam material, the higher the EMI shielding effectiveness. This reason for this is that the more porous the material, the more voids there are in the material, which in turn create more pore walls in the material. The increase in pore walls causes multiple reflections of the EM waves in the material, thereby leading to an increase in absorption of the EM waves. The graph 200 in FIG. 2 illustrates the EMI shielding effectiveness for several example metal foam materials. The samples range in porosity from P=75.61% to P=93.08%, where porosity is defined as the ratio of a volume of the voids in the material divided by the total volume of the material. As illustrated in the graph 200, the samples having a higher porosity P (e.g., 90% and above) have a better EMI shielding effectiveness than the samples having a lower porosity (e.g., below 90%). In particular, the frequency of high band EMI typically ranges from 200 MHz to 1000 MHz. Thus, as illustrated in the graph 200, the EMI shielding effectiveness of the two example metal foam materials having a porosity of 93.08% and 92.67% have an EMI shielding effectiveness ranging from 60 dB to 75 dB, which as previously mentioned is considered to be a high level of EMI protection.

Referring back to FIGS. 1A-1C, the electronic device 100 further includes a mold compound 120. The mold compound 120 covers the leadframe 102 with the exception of the external leads 104. In addition, the mold compound 120 encapsulates the die(s) 106 and the wire bonds 112, 116. In one example illustrated in FIGS. 1A and 1B, the mold compound 120 also encapsulates the radiation barrier 118. In another example illustrated in FIG. 1C, a surface (exposed surface) 122 of the radiation barrier 118 is substantially flush with a surface 124 of the mold compound 120. The exposed surface 122 is thus exposed to the external environment and is a surface of the radiation barrier 118 that faces away from the die(s) 106. The example in FIG. 1C can be used in high power applications, where heat dissipation is important. When mounted to a board (e.g., printed circuit board), the exposed surface 122 of the radiation barrier 118 is in contact with a metal plate on the board to facilitate the dissipation of heat generated by the die(s) 106. The examples in FIGS. 1A and 1B can be used in low power applications where heat dissipation is not an issue.

Figure 3:
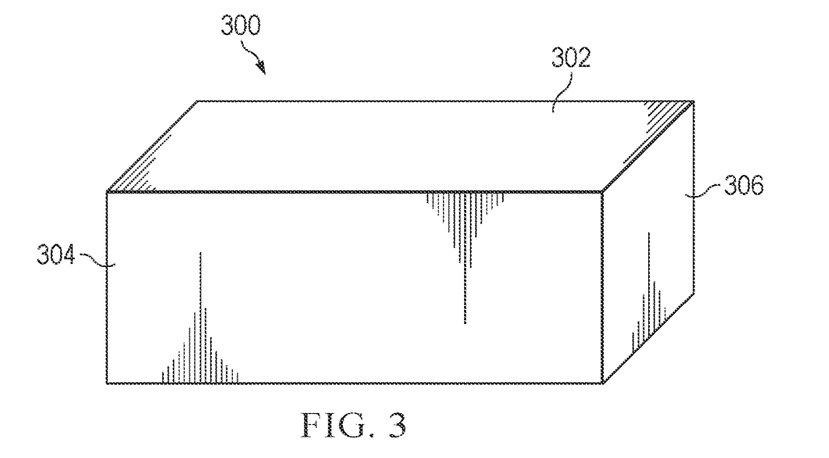
FIGS. 3-5 are perspective views of example radiation barriers.
Figure 4:
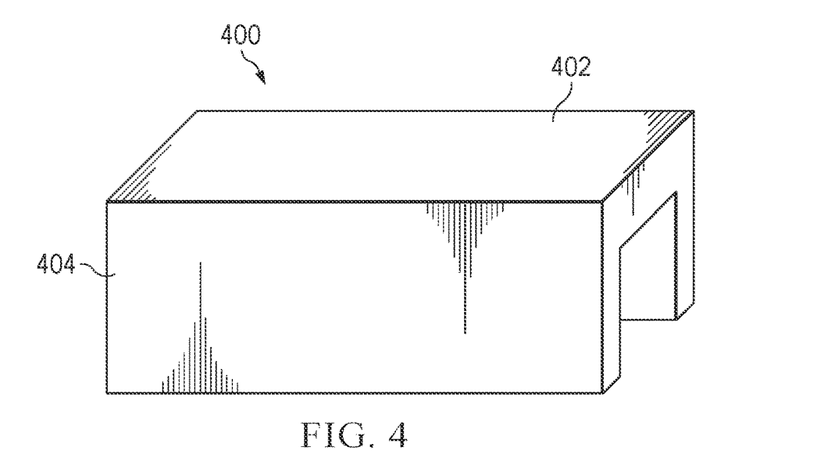

FIGS. 3-5 illustrate perspective views of example configurations of radiation barriers 300, 400, 500. In FIG. 3, the radiation barrier 300 is constructed such that the radiation barrier 300 includes a top 302, side walls 304, and end walls 306. This configuration can be used in a design where the radiation barrier 300 completely covers the die(s), as illustrated in FIGS. 1A and 1C. In FIG. 4, the radiation barrier 400 includes a top 402 and side walls 404. The radiation barrier 400, however, does not include end walls. Thus, the radiation barrier 400 has an open-ended configuration. The open-ended configuration can be used in applications where less than the total number of dies are to be covered by the radiation barrier 400 and where at least two of the dies are electrically connected to each other via a wire bond, as illustrated in FIG. 1B. In other words, this configuration allows the wire bond to be connected to two dies where one die may be covered by the radiation barrier 400 and the other die is not covered by the radiation barrier 400 without interference from the radiation barrier 400.

Figure 5:
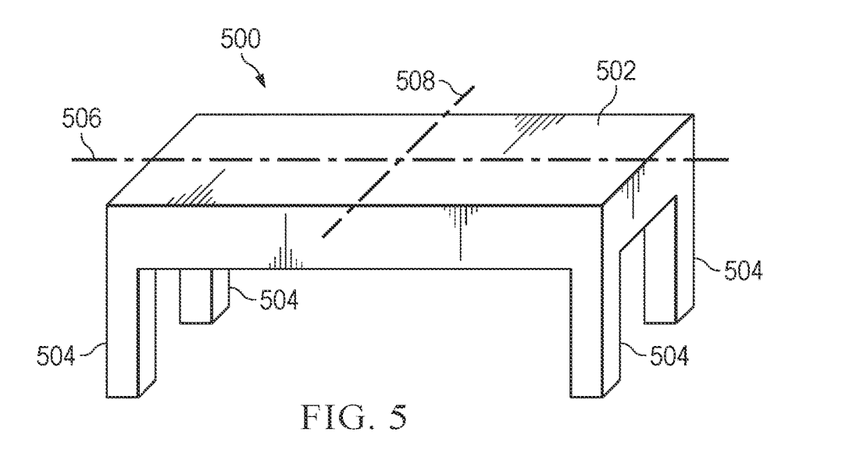

In FIG. 5, the radiation barrier 500 includes a top 502, but does not include side walls or end walls. Rather, the radiation barrier 500 can include posts or supports 504 at or near each corner of the radiation barrier 500. Thus, the radiation barrier 500 has an open-wall configuration. The open-wall configuration can be used in applications such as those illustrated in FIG. 1B. In addition, the open-wall configuration can be used in applications where a first die is connected directly to a second die in a first direction and connected to a third die is a second direction where the first and second directions are substantially perpendicular without interference from the radiation barrier 500. In other words, the first die may be covered by the radiation barrier 500. The second die, which is not covered by the radiation barrier 500, may be disposed along a longitudinal axis 506 of the radiation barrier 500 and is electrically connected to the first die via a wire bond, as illustrated in FIG. 1B. The third die, which also is not covered by the radiation barrier 500, may be disposed along a lateral axis 508 of the radiation barrier 500 that is substantially perpendicular to the longitudinal axis 506, and is electrically connected to the first die via a wire bond. Thus, the configuration in FIG. 5 facilitates an electrical connection between dies in multiple directions.

Figure 6:
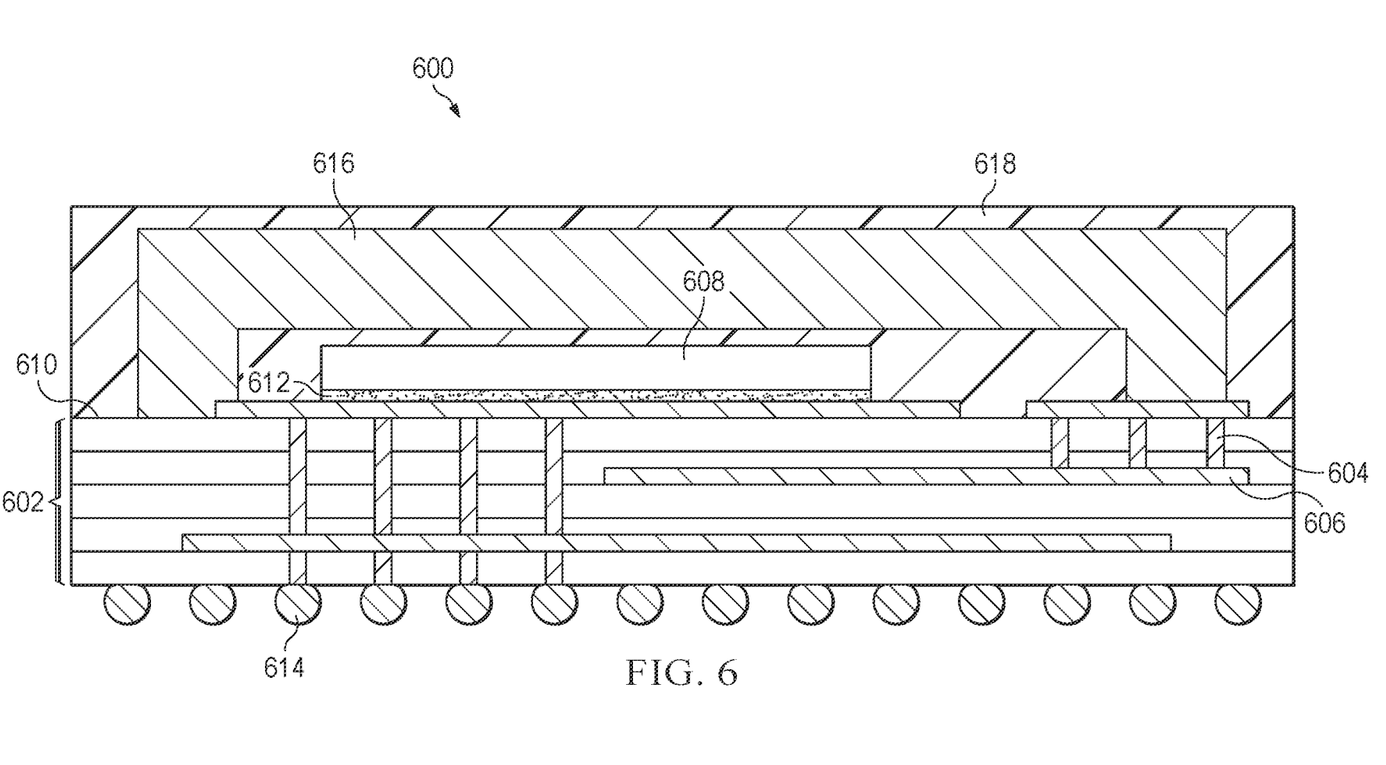
FIG. 6 is a cross-sectional view of another example electronic device.

FIG. 6 is a cross-sectional view of another example electronic device (e.g., integrated circuit (IC) package) 600 comprising a substrate (e.g., printed circuit board (PCB)) 602. The substrate 602 can comprise multi-layers, as illustrated in FIG. 6 or can comprise a single-layer. Thus, the example in FIG. 6 is for illustrative purposes only and is not intended to limit the scope of the invention. The electronic device 600 can comprise integrated circuit (IC) package including, but not limited to, a ball-grid array (BGA) package, a surface mount package (SMP), a through hole package (THP), a quad-flat no-lead (QFN) package, etc. The substrate 602 may include conductive vias 604 and conductive lines 606. At least one die 608 is attached to one of the conductive lines 606 disposed on a surface 610 of the substrate 602 via a die attach material 612. The conductive vias 604 and conductive lines 606 provide an electrical connection between the die 608 and an external device, such as another PCB via a conductive adhesive (e.g., solder) 614.

Although not illustrated in FIG. 6, in one example the die 608 may be connected to the substrate 602 via wire bonds that provide a connection between contact pads on the die 608 and corresponding contacts on the substrate 602. In another example, the electronic device 600 may be a ball-grid array package where the die 608 is a flip-chip die and where the die 608 is connected to the substrate 602 via solder balls that provide an electrical connection between exposed contact pads on a bottom surface of the die 608 and contacts on the substrate 602.

A radiation barrier 616 is disposed over the die 608. Alternatively, in a configuration that includes multiple dies 608, the radiation barrier 616 can be disposed over one die 608, as illustrated above in FIG. 1B or over a number of dies 608 that is less than the total number of dies 608 in the electronic device 600. As mentioned above, the radiation barrier 616 shields the die 608 from EM radiation caused by an external source. The radiation barrier 616 comprises the metal foam material (e.g., copper, aluminum, nickel) as described above and thus the details of the radiation barrier 616 will not be repeated.

The electronic device 600 further includes a mold compound 618 that encapsulates the die 608 and any conductive lines 606 disposed on the surface 610 of the substrate 602. In the example illustrated in FIG. 6, the mold compound 618 also encapsulates the radiation barrier 616. In another example, as described above and illustrated in FIG. 1C, a surface (exposed surface) of the radiation barrier 616 is substantially flush with a surface of the mold compound 618. As described above, the exposed surface is exposed to the external environment and is a surface of the radiation barrier 616 that faces away from the die 608.

Figure 7:
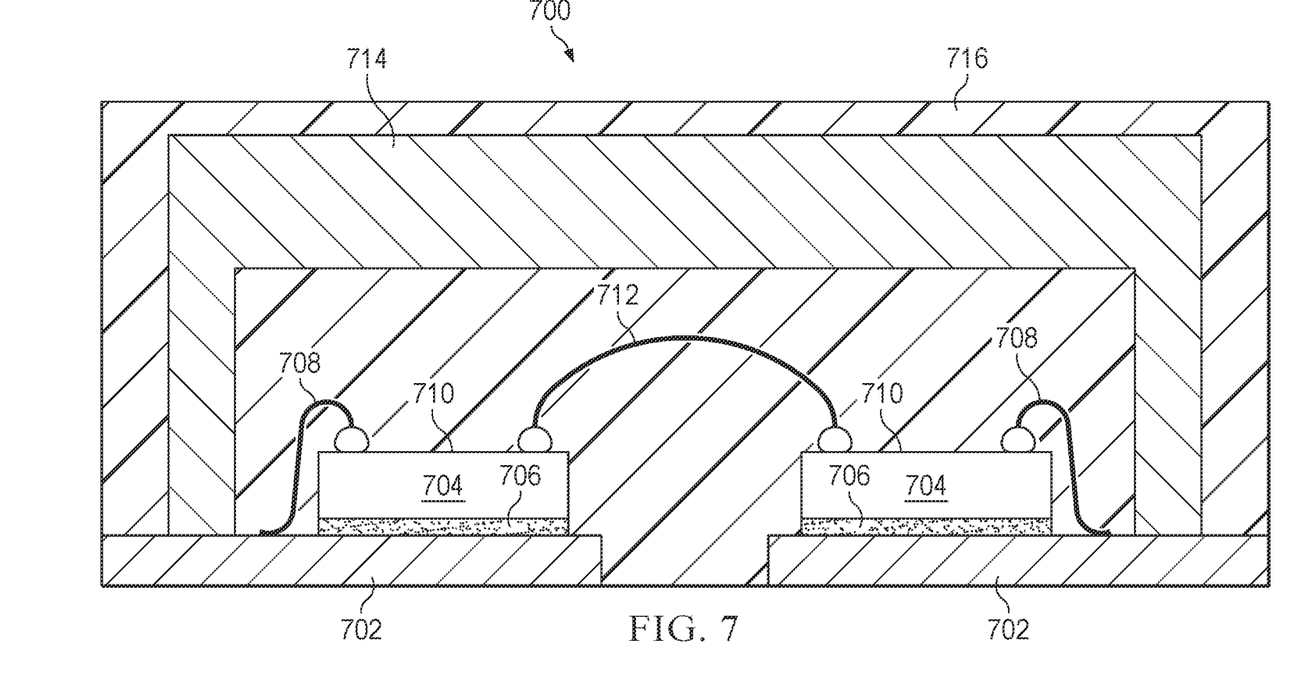
FIG. 7 is a cross-sectional view of another example electronic device.

FIG. 7 is a cross-sectional view of another example electronic device (e.g., integrated circuit (IC) package) 700 comprising a leadframe based substrate 702. At least one die 704 is disposed on the leadframe 702 via a die attach material 706. The electronic device 700 can comprise an integrated circuit (IC) package including, but not limited to a quad-flat no-lead (QFN) package, as illustrated in FIG. 7, a surface mount package (SMP), a through hole package (THP), a ball-grid array (BGA) package, etc. Although, FIG. 7 shows two dies 704, it is understood that the number of dies can range from 1-N, where N is a positive number greater than 0. Thus, the electronic device 700 illustrated in FIG. 7 is for illustrative purposes only and is not intended to limit the scope of the invention. The electronic device 700 further includes wire bonds 708 attached from an active surface 710 of the die 704 to the leadframe 702. In the example illustrated in FIG. 7 an additional wire bond 712 is attached to each active surface 710 of each die 704 to allow communication between the two dies 704.

A radiation barrier 714 is disposed over the dies 704 and the wire bonds 708, 712. Alternatively, in a configuration that includes multiple dies 704, the radiation barrier 714 can be disposed over one die 704, as described and illustrated in FIG. 1B, or over a number of dies 704 that is less than the total number of dies 704 in the electronic device 700. As mentioned above, the radiation barrier 714 shields the die(s) 704 from EM radiation caused by an external source. The radiation barrier 714 comprises the metal foam material (e.g., copper, aluminum, nickel) as described above and thus the details of the radiation barrier 714 will not be repeated.

The electronic device 700 further includes a mold compound 716 that encapsulates the die(s) 704 and the wire bonds 708, 712. In the example illustrated in FIG. 7, the mold compound 716 also encapsulates the radiation barrier 714. In another example, as described above and illustrated in FIG. 1C, a surface (exposed surface) of the radiation barrier 714 is substantially flush with a surface of the mold compound 716. As described above, the exposed surface is exposed to the external environment and is a surface of the radiation barrier 714 that faces away from the dies 704.

FIGS. 8A-8E illustrate a fabrication process associated with the formation of the electronic device 100 illustrated in FIG. 1A. Though depicted sequentially as a matter of convenience, at least some of the actions shown can be performed in a different order and/or performed in parallel. Alternatively, some implementations may perform only some of the actions shown. Still further, although the example illustrated in FIGS. 8A-8E is an example method illustrating the example configuration of FIG. 1A, other methods and configurations are possible. It is understood that although the method illustrated in FIGS. 8A-8E the fabrication process of a single electronic device, the process applies to an array of electronic devices. Thus, after fabrication of the array of electronic device the array is singulated to separate each electronic device from the array.

Figure 8A:
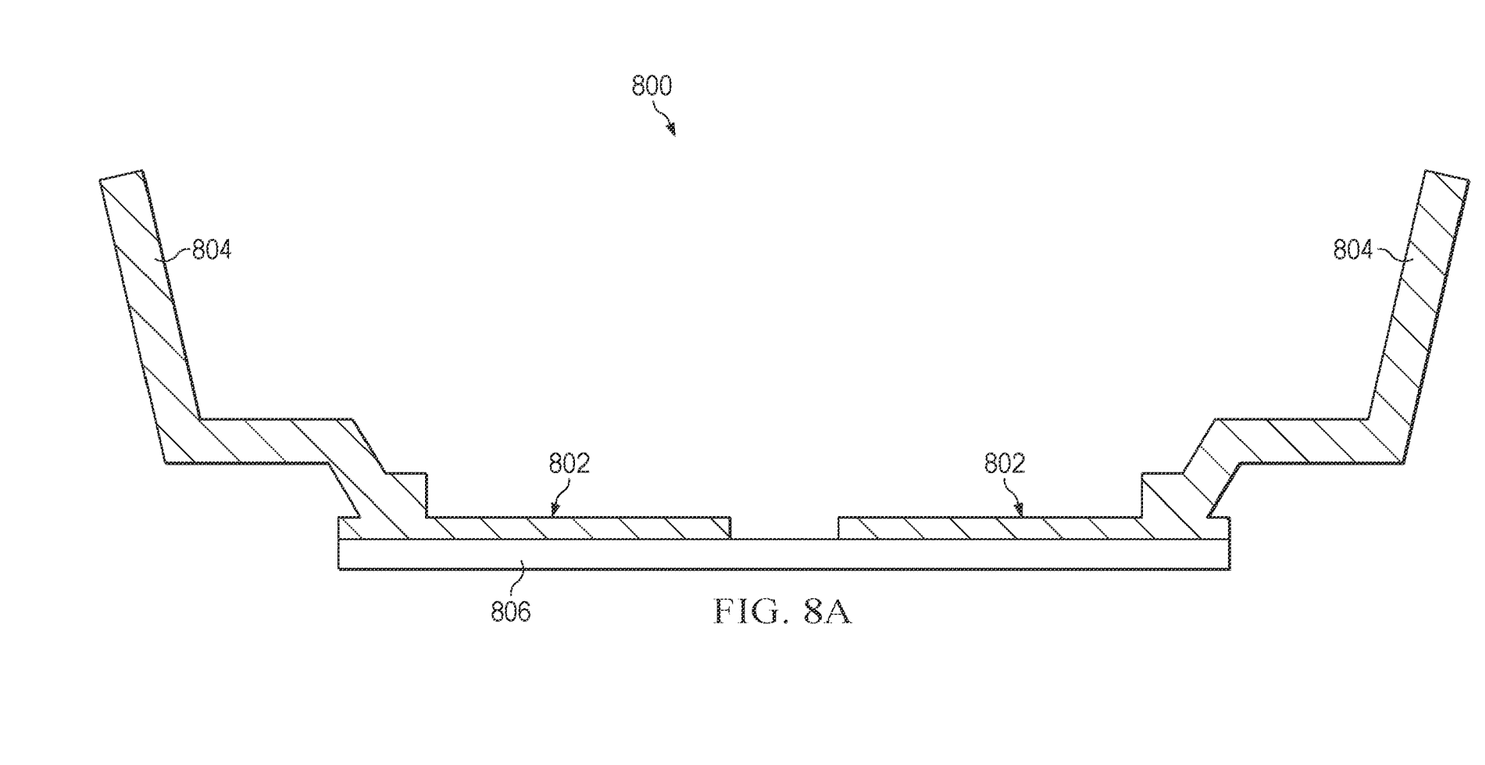
FIG. 8A illustrates a cross sectional view of the electronic device of FIG. 1 illustrating a leadframe in the early stages of fabrication.
Figure 8B:
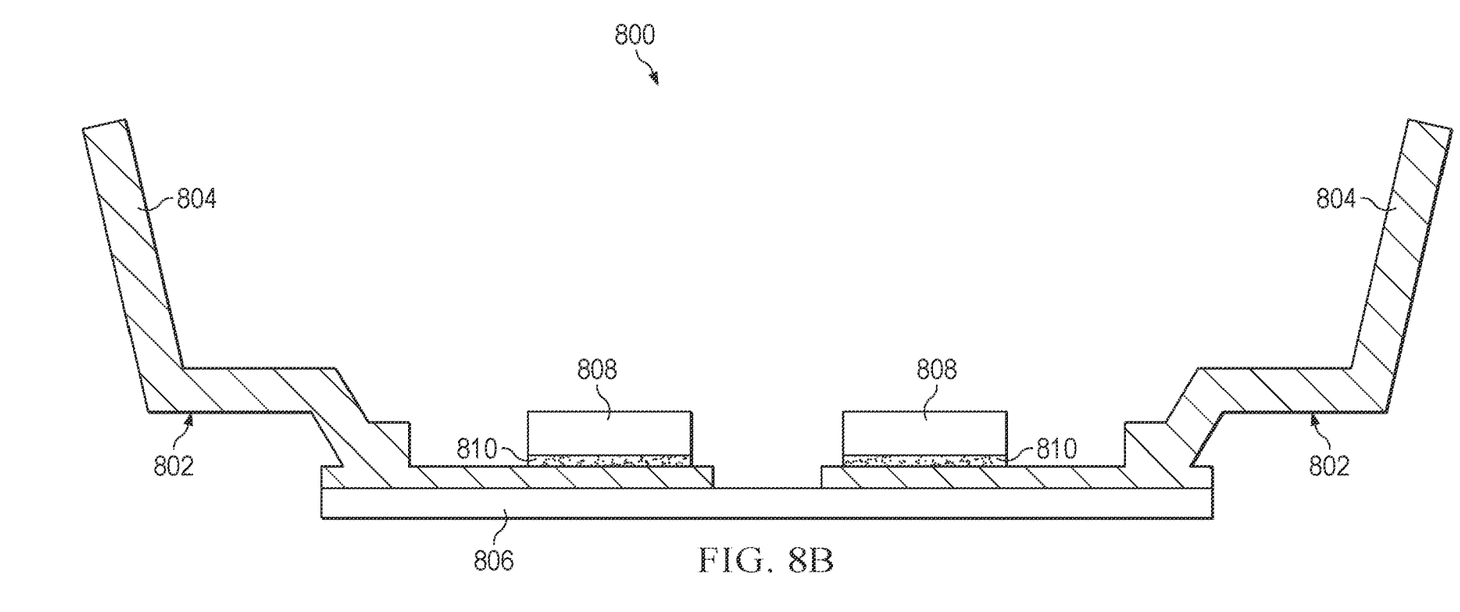
FIG. 8B illustrates a cross sectional view of the electronic device of FIG. 8A with dies attached to the leadframe.
Figure 8C:
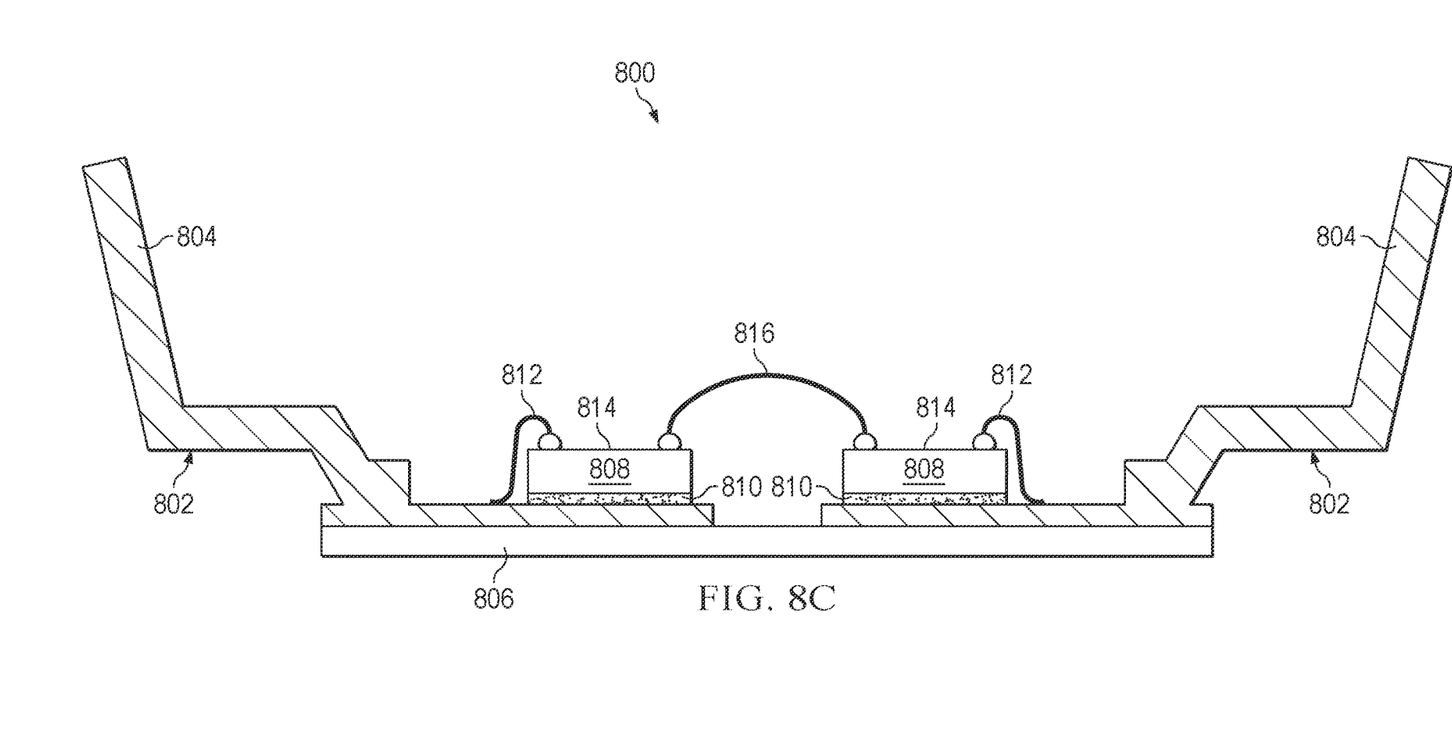
FIG. 8C illustrates a cross sectional view of the electronic device of FIG. 8B with wire bonds attached to the dies and leadframe.
Figure 8D:
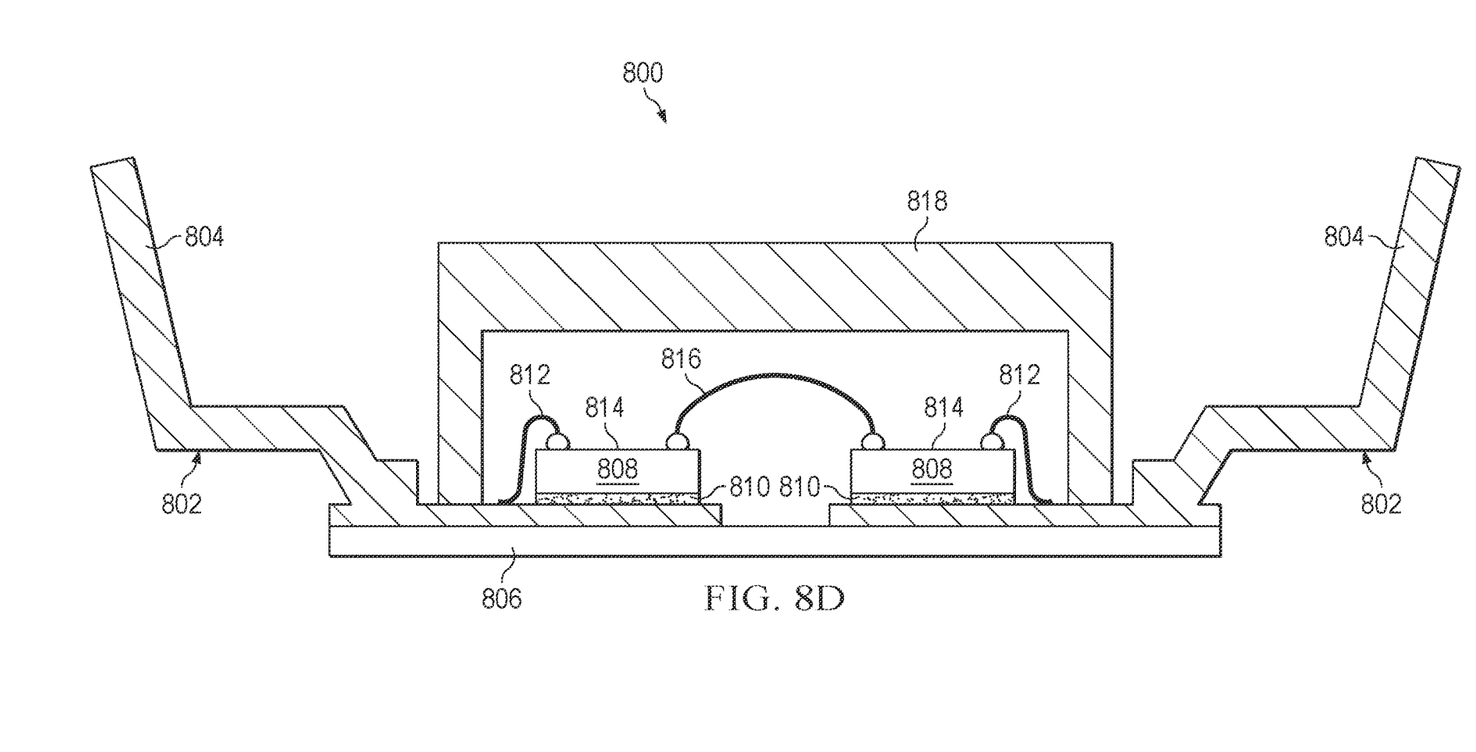
FIG. 8D is a cross-sectional view of the electronic device of FIG. 8C with a radiation barrier attached over the dies.

Referring to FIG. 8A, the fabrication process of an electronic device 800 begins with a leadframe based substrate 802 having external leads 804. The electronic device 800 may include an optional second substrate 806, as illustrated in FIG. 8A. At least one die 808 is attached to the leadframe 802 via a die attach material 810 resulting in the configuration n FIG. 8B. The electronic device 800 undergoes a reflow and curing process to adhere the dies 808 to the substrate 802. Wire bonds 812 are attached from an active surface 814 of the dies 808 to the leadframe 802. An additional wire bond 816 is attached between the active surface 814 of each die 808 to allow communication between the dies 808 resulting in the configuration in FIG. 8C. A radiation barrier 818 is disposed over at least one die 808 resulting in the configuration in FIG. 8D. The radiation barrier 818 can be placed on the substrate 802 via a pick and place process and can be attached to the substrate 802 via a conductive material, such as a conductive adhesive (e.g., adhesive compound) or solder. The radiation barrier 818 is connected to ground via the substrate 802.

Figure 8E:
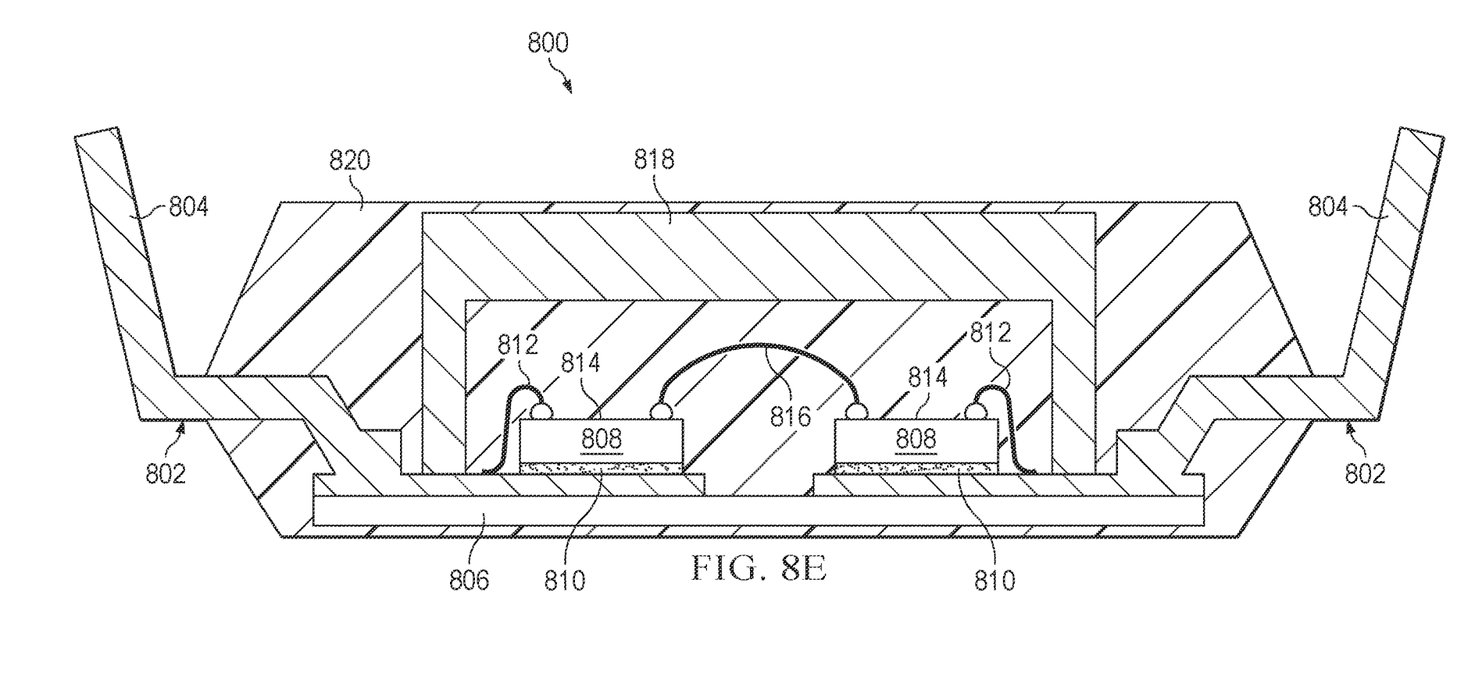
FIG. 8E is a cross-sectional view of the electronic device of FIG. 8D with after the formation of a mold compound.

Referring to FIG. 8E, a mold compound 820 is formed over the electronic device 800 such that the mold compound 820 covers a portion of the leadframe 802 with the exception of the external leads 804. In the addition, the mold compound 820 encapsulates the dies 808, the wire bonds 812, 816, and the radiation barrier 818. The mold compound 820 not only encapsulates the radiation barrier 818, the mold compound 820 also penetrates the radiation barrier 818 such that during the formation of the mold compound 820 fills the voids in the porous structure of the radiation barrier 818. Thus, the voids in the porous structure of the radiation barrier 818 are occupied by the mold compound 820 after the formation of the mold compound 820.

Figure 9:
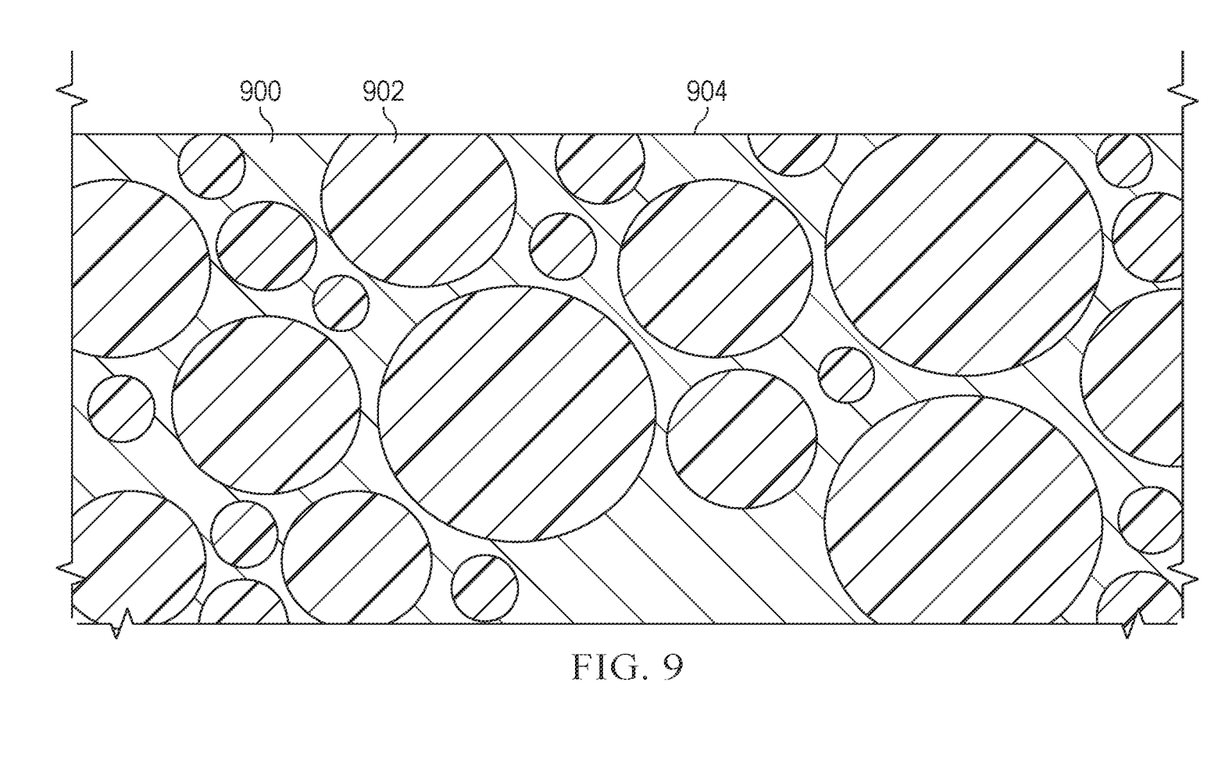
FIG. 9 is a cross-sectional view of a radiation barrier after formation of the mold compound.

For example, FIG. 9 illustrates a cross-sectional view of an example radiation barrier 900, comprised of a metal foam as disclosed herein, after the formation of a mold compound 902. As illustrated, the mold compound 902 fills voids in the radiation barrier 900. As a result, although the radiation barrier 900 may have an exposed surface 904 as illustrated in FIG. 1C, there are no significant adverse effects to the electronic device relating to strength, reliability, performance, etc.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean based at least in part.

What is claimed is:

1. An electronic device, comprising:
   a substrate;
   a die having an active surface, the die being disposed on the substrate;
   wire bonds attached from the active surface of the die to the substrate;
   an electromagnetic shield attached to the substrate and disposed over the die; and
   a mold compound formed over the die, the wire bonds, and the electromagnetic shield, wherein the electromagnetic shield comprises a metal foam material.

2. The electronic device of claim 1, wherein the electromagnetic shield is encapsulated in the mold compound.

3. The electronic device of claim 1, wherein a surface of the electromagnetic shield that faces away from the die is substantially flush with a surface of the mold compound that faces away from the die, thereby exposing the surface of the electromagnetic shield to an external environment to facilitate heat dissipation.

4. The electronic device of claim 1, wherein the metal foam material comprises a porous material and wherein the mold compound occupies voids in the porous material.

5. The electronic device of claim 4, wherein the porous material has a porosity of greater than 90%.

6. The electronic device of claim 1, wherein the metal foam material is an open-cell metal foam material made from at least one of copper, aluminum, and nickel.

7. The electronic device of claim 1, wherein the die is a first die, the electronic device further including a second die disposed on the substrate, wherein the electromagnetic shield covers the first die only.

8. The electronic device of claim 1, wherein the die is a first die, the electronic device further including a second die disposed on the substrate, wherein the electromagnetic shield covers both the first die and the second die.

9. The electronic device of claim 1, wherein the electromagnetic shield has a thickness ranging from 0.5 mm to 40 mm.

10. The electronic device of claim 1, wherein the substrate is a leadframe, the leadframe having external leads that extend outward from the mold compound.

11. The electronic device of claim 1, wherein the substrate is a leadframe, the leadframe having external leads that are substantially flush with surfaces of the mold compound.

12. The electronic device of claim 1, wherein the substrate is a printed circuit board, the printed circuit board having conductive vias and conductive lines that provide an electrical connection from the die to an external device.

13. The electronic device of claim 1, wherein the substrate is a multi-layered printed circuit board, the multi-layered printed circuit board having conductive vias and conductive lines that provide an electrical connection from the die to an external device.

14. A method of fabricating an electronic device, comprising:
    providing a leadframe;
    depositing a die on the leadframe;
    attaching wire bonds from the die to the leadframe;
    placing an electromagnetic shield over the die; and
    forming a mold compound over the die, the wire bonds, and the electromagnetic shield, wherein the electromagnetic shield comprises a metal foam material.

15. The method of claim 14, wherein forming the mold compound over the die, the wire bonds, and the electromagnetic shield includes encapsulating the die, the wire bonds, and the electromagnetic shield.

16. The method of claim 14, wherein the metal foam material comprises is a porous material and wherein the mold compound occupies voids in the porous material.

17. The method of claim 14, wherein forming the mold compound over the die, the wire bonds, and the electromagnetic shield includes encapsulating the die and the wire bonds, and forming the mold compound over the electromagnetic shield such that a surface of the electromagnetic shield that faces away from the die is substantially flush with a surface of the mold compound that faces away from the die, thereby exposing the surface of the electromagnetic shield to an external environment to facilitate heat dissipation.

18. The method of claim 14, wherein the die is a first die, the method further comprising depositing a second die on the leadframe, wherein the electromagnetic shield covers the first die only.

19. The method of claim 14, wherein the die is a first die, the method further comprising depositing a second die on the leadframe, wherein the electromagnetic shield covers both the first die and the second die.

* * * * *